(12) United States Patent
Klein et al.

(10) Patent No.: US 8,772,740 B2
(45) Date of Patent: Jul. 8, 2014

(54) UV CURING CREATING FLATTOP AND ROUNDTOP STRUCTURES ON A SINGLE PRINTING PLATE

(75) Inventors: Thomas Klein, Wolfenbuettel (DE); Wolfgang Sievers, Kremperheide (DE)

(73) Assignee: Esko-Graphics Imaging GmbH, Itzehoe (DE)

( * ) Notice: Subject to any disclaimer, the term of this patent is extended or adjusted under 35 U.S.C. 154(b) by 280 days.

(21) Appl. No.: 13/436,800

(22) Filed: Mar. 30, 2012

(65) Prior Publication Data

US 2012/0266767 A1    Oct. 25, 2012

Related U.S. Application Data (60) Provisional application No. 61/473,528, filed on Apr. 8, 2011.

(51) Int. Cl.
*B41C 1/05* (2006.01)
*G03F 7/20* (2006.01)
*G03F 1/76* (2012.01)

(52) U.S. Cl.
CPC ... *B41C 1/05* (2013.01); *G03F 1/76* (2013.01); *G03F 7/202* (2013.01); *G03F 7/2053* (2013.01)
USPC .............. 250/492.1; 250/504 R; 430/204; 430/306; 430/309; 101/401.1

(58) Field of Classification Search
CPC ............. B41C 1/05; G03F 1/76; G03F 7/202; G03F 7/2053
See application file for complete search history.

(56) References Cited

U.S. PATENT DOCUMENTS

| | | | |
|---|---|---|---|
| 8,227,769 B2 * | 7/2012 | Sievers | 250/492.1 |
| 2001/0052924 A1 * | 12/2001 | Steinke et al. | 347/225 |
| 2009/0294696 A1 | 12/2009 | Sievers | |
| 2011/0104615 A1 | 5/2011 | Sievers | |

* cited by examiner

*Primary Examiner* — Jack Berman
(74) *Attorney, Agent, or Firm* — Dov Rosenfeld; Inventek (57) ABSTRACT

A method of imaging a printing plate and curing the printing plate made of or having photo-curable material that includes an ablatable mask. In one embodiment, the method comprises imaging the ablatable mask with a first portion of imaging data to produce a partially imaged uncured plate. Imaging data includes the first portion and a second portion of imaging data. The method includes curing the partially imaged uncured plate using UV with a first set of parameters to produce a partially cured plate with a partially ablated mask thereon, the curing arranged for producing flat tops, imaging the partially ablated mask on the partially cured plate with the second portion of imaging data to produce a totally imaged partially cured plate, and curing the totally imaged partially cured plate with a second set of one or more curing parameters to produce a totally cured plate to produce round tops.

19 Claims, 9 Drawing Sheets

UV CURING CREATING FLATTOP AND ROUNDTOP STRUCTURES ON A SINGLE PRINTING PLATE

RELATED PATENT APPLICATIONS

This invention claims benefit of priority of U.S. Provisional Patent Application No. 61/473,528 to inventors Klein et al., filed 8 Apr. 2011, titled "UV CURING CREATING FLATTOP AND ROUNDTOP STRUCTURES ON A SINGLE PRINTING PLATE," the contents of which are incorporated herein by reference

FIELD OF THE INVENTION

The present disclosure relates generally to printing and in particular to creating printing plates.

BACKGROUND

This disclosure describes a method and an apparatus for improving light exposure, e.g., ultraviolet exposure of photo-curable printing plates, e.g., photopolymer flexographic printing plates, letterpress plates and other polymer printing plates, as well as polymer sleeves and polymer coated printing cylinders. Photo-curable, of course, means curable by photons, e.g., light, e.g., light in the ultraviolet range or some other range.

Photopolymer plates have found a broad range of applications. A variety of different methods can be applied for transferring an image for printing, e.g., in the form of imaging data, to a polymer plate. For example, an image mask, which can be a film applied to the surface of the plate while the plate is exposed, or can be an ablatable layer directly on top of the polymer surface that is laser ablated to form a mask.

By a digital plate is meant a plate that is exposed to imaging data by ablating a mask material that is on the plate, e.g., by exposure to laser radiation in an imaging device. The process of producing a digital plate is called a digital process herein. After exposure, the plate needs light, e.g., UV light for curing. It is known to carry out in-line curing on the same apparatus that is used to expose the plate to imaging data.

Polymer printing plates are three dimensional, that is, include a depth dimension from the printing surface. Small printing details on the plate's surface carry ink for printing. For line art and other small features, it is common to have printing features that are substantially flat. Such a feature is called a flat top herein. It is also common to produce features on digital plates tend to have rounded surfaces that extend down in depth. Such a feature is called a round top herein.

Flat tops allow much higher ink transfer volume in the print compared to round tops, especially for solid areas and line work that have been screened with a high frequency pattern. However, for some applications, flat tops have some disadvantage. Screen dots printed with flat tops for low percentage screen dot areas in highlights of a print may end up with too much ink transfer.

Many printing plate jobs include line work as well as screened areas. Pure flat top structures may not be suitable for use in such jobs without compromising the quality of the screened areas of the job. Too much ink transfer in highlight regions means the lowest printable gray scales are higher than with conventional digital printing with round tops. This limits the gray scale range available.

To overcome this problem, some printing plate fabricators use two sets of plates for the same job: a first set of plates, e.g., one plate for each color for line work and a second set of plates, e.g., one plate for each color for the screen portion of the job.

DESCRIPTION OF EXAMPLE EMBODIMENTS

Overview

Embodiments of the present invention includes a method, an apparatus, and a computer-readable storage medium containing instructions that when executed by a machine cause carrying out the method. Embodiments of the invention also include a printing plate generated using the method. The method is to produce a printing plate that includes, after curing, both flat tops and round tops on the same plate.

One embodiment includes a method of imaging a printing plate with imaging data and curing the printing plate made of or having photo-curable material thereon. The photo-curable material includes an ablatable mask thereon. The method includes imaging the ablatable mask on the printing plate with a first portion of imaging data to produce a partially imaged uncured plate. The imaging data comprises the first portion of imaging data and a second portion of imaging data. The method further includes curing the partially imaged uncured plate using light energy at a wavelength or wavelengths suitable for curing the photo-curable material with a first set of one or more curing parameters to produce a partially cured plate with a partially ablated mask thereon, the curing providing total energy per unit time per unit area arranged for producing features of a first kind. The method further includes imaging the partially ablated mask on the partially cured plate with the second portion of imaging data to produce a totally imaged partially cured plate, and curing the totally imaged partially cured plate with a second set of one or more curing parameters to produce a totally cured plate, the curing providing total energy per unit time per unit area arranged for producing features of a second kind. The first set of imaging parameters and the second set of imaging parameters are arranged such that the first portion of imaging data has printing features of the first kind on the totally cured plate and the second region of imaging data has printing features of the second kind on the totally cured plate.

In some versions, the features of a first kind are flat top features, and the features of a second kind are round top features.

In some embodiments, the curing uses UV light, and the first and second sets of curing parameters differ in at least one of UV irradiance, UV power, UV exposure time, and, in the case there is periodic repeating exposure of any part of the plate, the period of repetition.

Particular embodiments include a printing plate prepared and cured according to the method.

Particular embodiments may provide all, some, or none of these aspects, features, or advantages. Particular embodiments may provide one or more other aspects, features, or advantages, one or more of which may be readily apparent to a person skilled in the art from the figures, descriptions, and claims herein.

Curing Polymer Plates:

The term photopolymer plate, or in its shortened form, polymer plate is used herein to refer to any printing plate, cylinder or sleeve that is cured by application of light, such as ultraviolet (UV) radiation, i.e., that is made of or has thereon a photo-curable material such as a photopolymer. While today, the UV curable material is typically made of a polymer, hence the term, in this disclosure including the claims, a photopolymer plate, or a polymer plate for short, means a plate, cylinder or sleeve made of or with any UV curable material thereon.

UV curing will briefly be described by way of background. The present invention, however, does not depend on any particular theory.

It is believed that the absence or presence of oxygen during the curing process plays an important role in the shape of the three-dimensional structure in the plate. It is believed that oxygen acts as an inhibitor to the polymerization: oxygen molecules stop the chain reaction of polymerization and restrict the length of polymer chains formed by the polymerization. The oxygen inside the plate material is consumed by this process.

A certain amount of oxygen already exists inside the plate materials when the UV curing starts. Additional oxygen from the surrounding air can enter the plate during the curing process once the oxygen concentration inside the plate drops.

Figure 1:
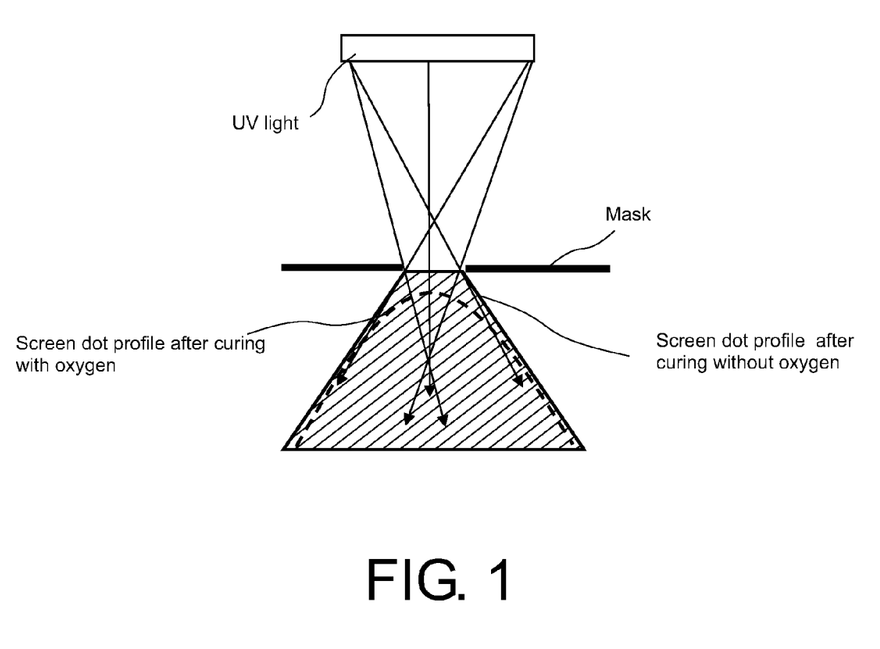
FIG. 1 shows a simple cross-section of an example halftone dot that results from UV exposure through a mask by UV light from a UV source.

FIG. 1 shows a simple cross-section of an example halftone dot that results from UV exposure through a mask by UV light from a UV source. The solid line shows the halftone dot profile when there is no or relatively little oxygen during curing, while the broken line shows a simple example of the sort of dot profile that results when there is a lot of oxygen during curing, i.e., during the polymerization process. The presence of oxygen is believed to cause shorter polymer chains than with less oxygen, resulting in a kind of melting of the halftone dots as shown in the broken line profile in FIG. 1.

Figure 2:
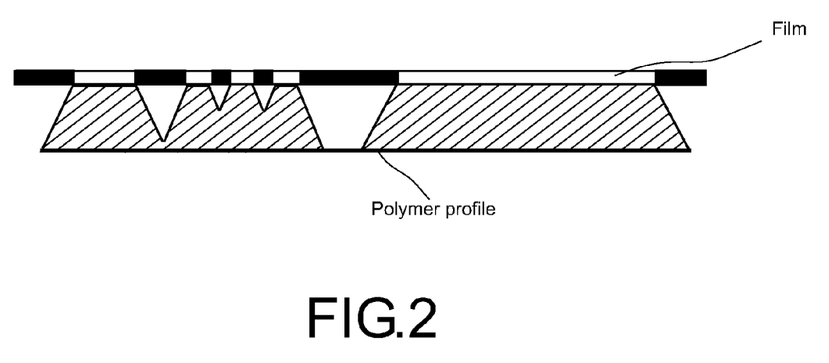
FIG. 2 which shows a simple cross-section of an example printing pattern with flat tops that results from UV exposure through a film mask by UV light from a UV source; the shape is called a flat top shape herein.

In an analog plate process, e.g., in which a film with the image thereon is placed on top of the polymer plate, and the polymer plate is cured by UV light, the UV light enters via the film. The film is believed to act as a barrier for the oxygen from the environment. This makes the polymer grow until the top of the surface as shown by the solid line in FIG. 1, and also as in FIG. 2 which shows a simple cross-section of a simple example printing pattern with flat tops that results from UV exposure through a film mask by UV light from a UV source. Such a shape is called a flat top shape herein. One property of flat top halftone dots is that they are capable of producing printed dots that each have sharp dot edges.

Figure 3:
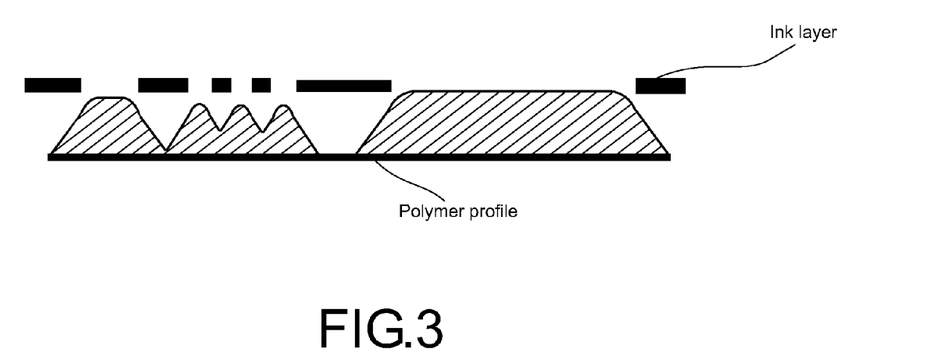
FIG. 3 shows a simple cross-section of an example printing pattern with round tops that results from UV exposure through a laser ablated film by UV light from a UV source; such a rounded shape is called a round top shape herein.

In a digital printing process, e.g., in which an ablatable layer is ablated with a laser beam, the plate material underneath is cured by UV light entering the plate through the revealed areas. Oxygen can also readily enter the plate through these ablated areas and through the ablatable material as well. It is observed that the halftone dots do not grow flat, and may not reach up to the original surface level of the polymer plate, but instead build round shaped structures which stay at slightly below the original surface level, as shown, for example by the dotted line of FIG. 1. FIG. 3 shows a simple cross-section of a simple example printing pattern with round tops that results from UV exposure through a laser ablated film by UV light from a UV source. Such a rounded shape is called a round top shape herein.

Round tops are sometimes desirable because they can be used to form very small halftone dots. It is sometimes desired to obtain flat tops because they define edges well, so are suitable, e.g., for line work and solid regions in an image. Furthermore, flat top dot structures can hold small dots or linework elements that have a very high spatial frequency, which significantly increases ink laydown.

Digital processes offer the advantage that no film or film processing equipment or the related chemicals are necessary. Digital processes are also believed to be more precise and capable of smaller dot sizes and higher line count resolutions. It is sometimes desired to obtain flat tops with a digital process. One known method includes placing a film over the ablated material during curing to simulate a conventional analog process. However, such a process is cumbersome, and furthermore, choosing between a flat top and a round top result requires more equipment and more workflow methods. Also known are methods wherein the intensity of exposure to curing light radiation is at two different intensity levels. The different intensity levels may be obtained by having a light source that is switchable between two different intensity values, or by modifying the relative speed between the light exposure unit and the plate during curing, which can affect the shape of the resulting features.

Described herein are an apparatus and a method of curing plates made of or having photo-curable material thereon that enable an operator to have some features with flat tops and others with round tops on the same plate using digital workflow equipment. Features of embodiments of the invention include the easy incorporation into a workflow for inline exposure according to an imaging pattern and curing.

Embodiments of the present invention include a method, an apparatus, and a printing plate generated using the method. The method is to produce a printing plate that includes, after curing, both flat tops and round tops on the same plate. As this method avoids needing a second plate when both screened areas that should have round tops, and other areas, e.g., line art areas that should have flat tops are included in the same job.

Some Embodiments

Embodiments of the invention include a method of curing printing plates and an apparatus for curing printing plates. The plates are made of or have thereon photo-curable material, e.g., UV curable material such as photopolymer. The methods and apparatuses allow the shape of three dimensional printing features, such as halftone dots and other structures on the printing plate to be controlled, and in particular, allow some structures on the plate to have round tops, and others to have flat tops.

Embodiments of the method and the apparatus are applicable to digital flexography, digital letterpress printing, and/or to making other digital printing plates, as well as for curing polymer sleeves and polymer coated printing cylinders.

The apparatus includes a light exposure unit including a light source, e.g., a UV source, and a drive mechanism to produce relative motion between the light exposure unit and the plate during curing of the plate, and a control system configured to control the drive mechanism and the light exposure unit. The apparatus further includes an imaging subsystem for exposing the plate according to imaging data. The imaging data comprises a first portion of imaging data that includes features that are desired to result in flat top structures on the printing plate, e.g., lineart features, and a second portion of imaging data that includes features, e.g., screened features that are desired to result in round top structures on the printing plate.

In different embodiments of the invention, the control system is configured to control, in some embodiments the relative speed of the relative motion between the light exposure unit and the plate during curing, and in some embodiments that include a light exposure unit that is switchable between a high intensity and a lower intensity, to control the intensity of the light output from the light exposure unit during curing.

Figure 5:
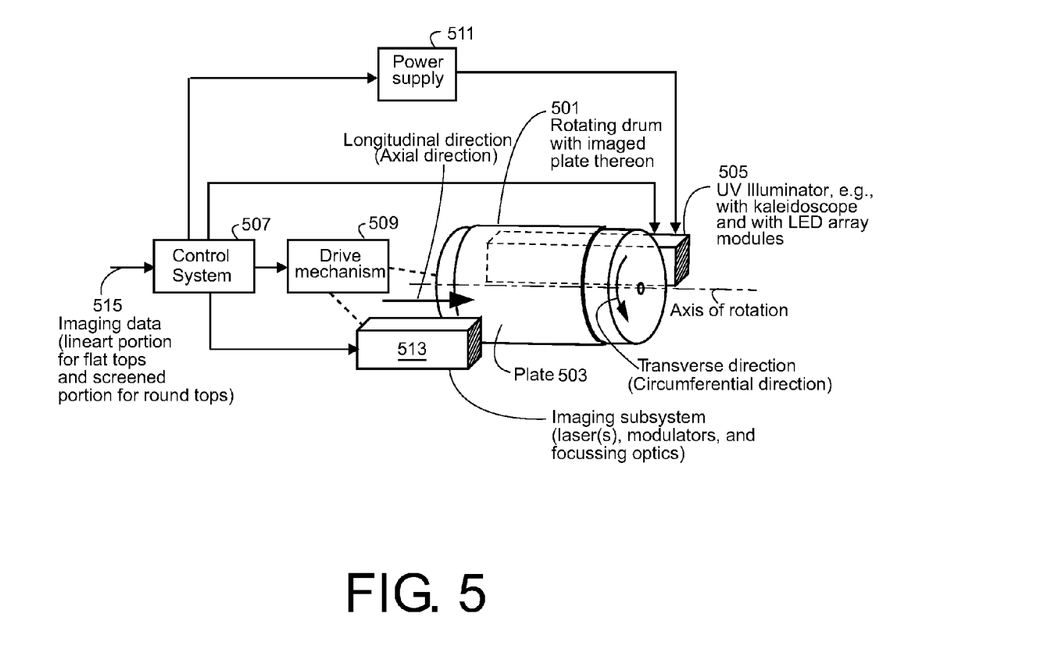
FIG. 5 shows a simplified block diagram of one embodiment of a curing apparatus that includes a rotating drum with a polymer plate thereon.

FIG. 5 shows a simplified block diagram of one embodiment of the invention that includes a rotating drum 501 with a polymer plate 503 thereon, the plate 503 being an imaged plate, that is, having the image mask thereon. An exposure unit with light source 505, e.g., a UV source moves or extends along the direction parallel to the drum axis—what is called the longitudinal direction. A control system 507 is connected to a drive mechanism 509, a power supply 511, the exposure unit 505, and an imaging subsystem 513 that is shown in simplified form, and that includes one or more laser(s), a modulator and optics to focus one or more modulated beams onto the surface of the plate 503.

The apparatus is arranged to accept imaging data 515 into the control system. The imaging data 515 may include a first portion of imaging data that includes features that are desired to result in flat top structures on the printing plate, e.g., lineart features, and a second portion of imaging data that includes features, e.g., screened features that are desired to result in round top structures on the printing plate. The apparatus also is arranged such that the drive mechanism under control of the control system produces relative motion between the light source 505 and the plate 503 during imaging of the plate according to the first or the second or any portion of the imaging data, or all the imaging data. The control system during imaging produces one or more modulated beams, modulated according to the imaging data.

The apparatus also is arranged such that the drive mechanism produces relative motion between the light source 505 and the plate 503 during curing of the plate by at least one rotation of the drum, and a control system coupled to and configured to control the drive mechanism and light exposure unit. In one embodiment, at any time during curing, the light source 505 illuminates a relatively small proportion of the extent of the printing plate in the transverse direction of rotation of the drum. In another embodiment, the light source 505 illuminates a longer proportion, or the whole extent.

Embodiment in which Round Tops or Flat Tops are Selected According to Rotational Speed In one embodiment, the rotational speed is variable. In such an embodiment, the light intensity from the light source is applied repeatedly and periodically to any region according to the rotational speed of the drum. Denote the period by T and the rotational speed by $\omega$ radians per sec, i.e., $60\omega/2\pi$ RPM. The period T is $2\pi/\omega$. Denote the time spent on any point on the plate during a sweep of period T by $\Delta T$, so that at any point in time during each sweep, $\Delta T/T$ of the plate's extent in the transverse direction is illuminated. It has been noted that when T is relatively small, e.g., significantly less than about half a second for many common photopolymer materials and a common geometry wherein, for example, $\Delta T/T$ is 1/10 or less, then round tops are produced, while when T is more than about 1 to 2 s for the same photopolymer materials, then flat tops can be produced, in all cases maintaining the overall UV dose constant. These speeds were found to depend on the plate material, the intensity of the light source, and on the proportion of the plate that is illuminated at any one time. As an example, for the rotational speed less than 60 RPM, e.g., around 30 RPM or less, flat tops can be produced, and for rotational speed more than 120 RPM, round tops can be produced.

Denote by $I_R$ effective intensity for producing round tops. This is the intensity that the plate would be cured at in a traditional bank UV curing system. $I_R$ is around 20 mW/cm$^2$ for common photopolymer materials. Denote by $I_F$ the effective intensity for producing flat tops. When $I_R$ is around 20 mW/cm$^2$ for common photopolymer materials, the inventor has found that $I_F$ is around 40 mW/cm$^2$. While higher values of $I_F$ may be used, too high a value may produce concave halftone dots rather than flat tops.

The UV dose (the fluence) is the energy per unit area. For common photopolymer plates such as Cyrel™ photopolymer plates made by E.I. du Pont de Nemours and Company of Wilmington, Del., USA, the dose for curing is between 7 to 15 Joule/cm$^2$. For thick plates, the required fluence may be around 20 Joule/cm$^2$.

The intensity generated by the light source's output aperture varies from 100 mW/cm$^2$ to as high as 400 mW/cm$^2$ depending on the type of source.

One possible theory of operation for why the invention works is that if the relative speed of relative motion of the light source to the to-be-cured plate is fast enough, the received UV energy is integrated over the exposure time. That is, the UV light is distributed over the entire plate surface.

Suppose the irradiation of any region occurs by repeated radiation by the light source over a certain duty cycle. Suppose the UV radiation is repeated each period of time denoted by T, and occurs for an active time $\Delta T$. T of course is inversely proportional to the speed or relative motion between the light source and the plate.

The inventors have found that the effective intensity presented to the polymer material depends on the relationship between a time constant, denoted $\tau$ of the order of 1 second for most materials. This is thought to be the time constant for the mobility of oxygen in the polymer material. If the irradiation of any give area of time occurs with a sufficiently high repetition rate with a relatively low duty cycle, that is, if for any part of the photopolymer, after each active time interval and before the repeated active time interval, there will be insufficient time for oxygen to stop polymer chains, then the exposure to light is integrated over the overall exposure time.

The inventors have found that there is an effective UV intensity. Denote by $I_0$, the intensity from the light source in units of power per unit area. The effective intensity, denoted $I_{\it{eff}}$ is:

$$I_{\it{eff}} = I_0[1-(1-\Delta T/T)\exp(-T/\tau)].$$

Note that if $T \geq \tau$, e.g., if $T >> \tau$, e.g., if $T > 2\tau$, then $I_{\it{eff}} \approx I_0$, while if $T << \tau$, e.g., if $T < 0.2\tau$, $I_{\it{eff}} \approx (\Delta T/T)I_0 < I_0$.

The inventors have observed that $t$ is in the order of 10 s to 20 s for common photopolymer materials such as, for example, Cyrel DPR™ from E.I. Dupont de Nemours and Company, Wilmington, Del. (DuPont), or the Nyloflex™ ACE printing plate from Flint Group of Luxembourg.

To produce round tops, suppose $T << \tau$, e.g., $T < 0.2\tau$, so that $I_{\it{eff}}[1-(\Delta T/T)]I_0$. Suppose further that $I_{\it{eff}} = I_R = 20$ mW/cm² for producing round tops.

For example, for a geometry in which 10% of the extent of a plate is illuminated at any one time, $I_0 = 20/(\Delta T/T) = 200$ mW/cm².

As an example, using this value for $I_0$, to determine the period of repetition to achieve 40 mW/cm², considered to be suitable to achieve flat tops, $T/\tau = \ln(9/8) \approx 0.12$. For $\tau$ approximately equal to 16 s, $T \approx 2$ s so that in the case of a rotating drum arrangement, the drum would rotate at approximately 30 RPM or less.

Hence, in rotating drum embodiments of the invention, if the speed of rotation is such the that period of rotation is less than 1 s, i.e., if the drum rotates at less than about 60 RPM, e.g., at 30 RPM or lower, then halftone dots having flat tops are produced. If on the other hand, the speed of rotation is more than 60 RMP, e.g., over 120 RPM, then round tops are produced.

See FIG. 9 and the explanation thereof under the section titled "Possible theory of operation" herein below.

Thus, one embodiment has been described in which the drive mechanism causes the light source to move along the direction of the axis of rotation of a rotatable drum having a plate thereon while the drum is rotated by the drive mechanism in order to cure the curable material of or on the plate. The drive mechanism together with the control system is such that the speed of rotation can be controlled so as to result in either flat top halftone dots for relatively slow speed of rotation below 60 RPM, e.g., 10 to 30 RPM and round tops for speeds of rotation above 60 RPM, e.g., 400 RPM for round tops.

Some embodiments use LED arrays, e.g., UV LED arrays for the light source 505. Such arrays are made, for example, by Nichia Corporation of Tokyo Japan. Such LED arrays feature having a relatively small amount of waste energy. Thus, in one embodiment, the light source of exposure unit 505 includes a plurality of LEDs. The LEDs are arranged so that the output intensity at the output aperture of the light source, denoted $I_0$, is between 100 mW/cm² and 400 mW/cm², depending on the number of LED arrays in the source, and the current applied to the LEDs. In one embodiment, an adjustable power supply to supply power to the LEDs is included, and such power supply can produce various currents to drive the LEDs under control of the control system.

In one embodiment, the light exposure unit includes a light tunnel of light-reflective, e.g., mirrored walls and has a polygonal cross-section like a kaleidoscope. Each wall has a reflective inner surface. The light source is located at or near one end, called the source end of the light tunnel and arranges to produce light radiation to the inside of the light tunnel towards the other end of the light tunnel, called plate end, including towards the reflective inner surfaces of the walls.

In one embodiment in which LEDs are used, the current through the LEDs is adjusted such that $I_{\it{eff}}$ when the drum rotates at more than about 60 RPM, e.g., at 400 RPM, is about 20 mW/cm², and such that the $I_{\it{eff}}$ for flat tops is 40 mW/cm².

While one embodiment includes a light exposure unit that includes LED arrays, alternate embodiments may use different ways of achieving output illumination intensity.

In one alternate embodiment, the light source includes a plurality of arc lamps. In another embodiment, the light source includes fluorescent lamps, e.g., fluorescent light tubes.

In another embodiment, the plate is on a flatbed, e.g., of a flatbed scanner, also called an x-y table, and a drive mechanism is configured to produce relative motion between the exposure unit and the plate.

Figure 6:
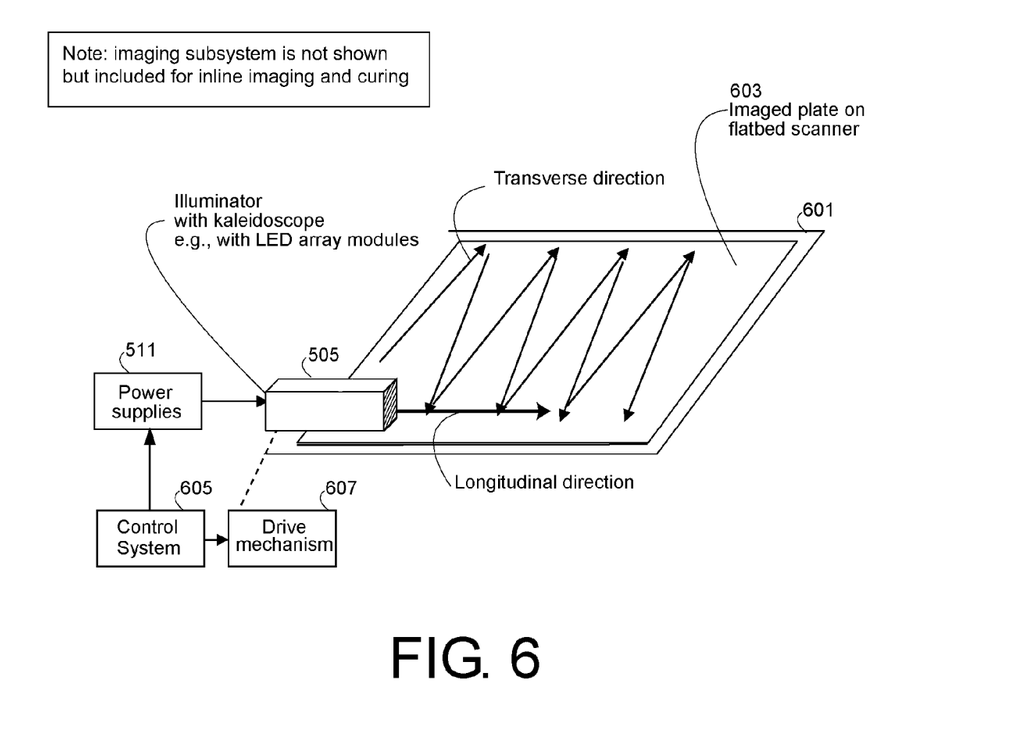
FIG. 6 shows in simplified form one example embodiment of a flatbed illuminating arrangement.

In one such embodiment, the light source moves during curing above the plate placed on a flatbed table. FIG. 6 shows a simplified block diagram of one embodiment of such a flatbed 601 in which a plate 603 with a mask thereon is cured. A control system 605 is coupled to a power supply 511 and configured to control the output of an illumination unit 505. The control system 605 also is coupled to and configured to control a drive mechanism 607 that is configured to move the illumination unit 505 back and forth in a transverse direction while also moving the illumination unit 505 in a longitudinal direction. The drive mechanism together with the control system is such that the speed of back and forth motion and repetition rate can be controlled so as to result in either flat top halftone dots for relatively slow repetition rate with a period of repetition more than about 1 second, e.g., around 2 to 4 seconds, and round tops for relatively fast repetition rate with a period of repetition less than about 1 second, e.g., 0.5 s or less, or better, around 0.2 s second or less for round tops.

Not shown in FIG. 6 is the imaging subsystem that is used for inline curing in a combined imaging and curing apparatus.

Figure 7:
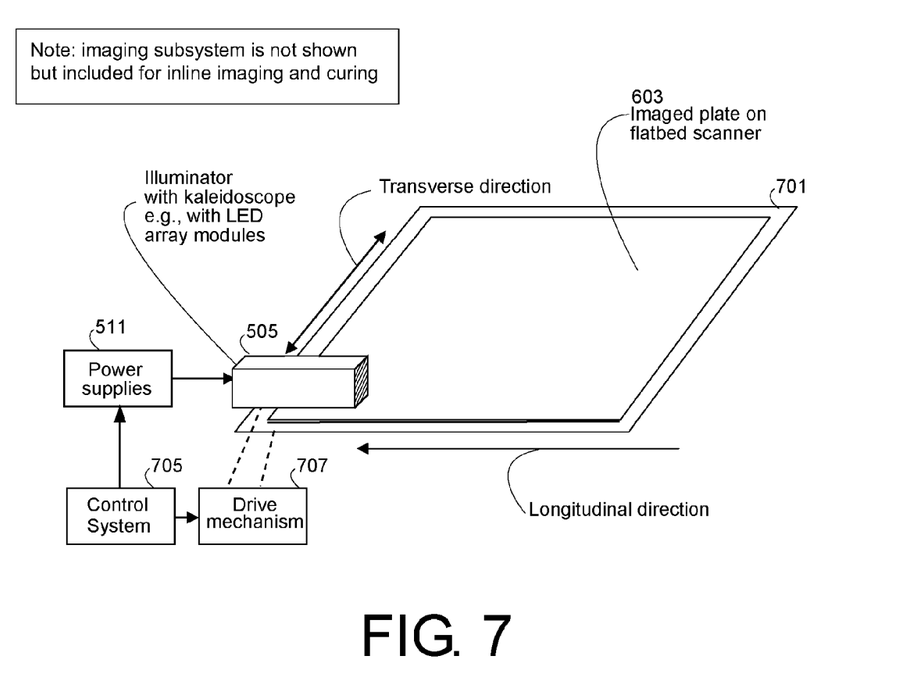
FIG. 7 shows in simplified form another example embodiment of a flatbed illuminating arrangement.

In another embodiment, the light source moves during curing in a transverse direction and the polymer plate moves during curing in a longitudinal direction perpendicular to the transverse axis. FIG. 7 shows a simplified block diagram of one embodiment of such a flatbed 701 in which a plate 603 with a mask thereon is cured. A control system 705 is coupled to a power supply 511 and configured to control the output of an illumination unit 505. The control system 705 also is coupled to and configured to control a drive mechanism 707 that is configured to move the illumination unit 505 back and forth in a transverse direction while also moving the plate in a longitudinal direction. The back and forth motion is controllable to achieve either flat tops or round tops so as to result in either flat top halftone dots for relatively slow repetition rates with a period of repetition more than about 1 second, e.g., around 2 to 4 seconds, and round tops for relatively fast repetition rates with a period of repetition less than about 1 second, e.g., 0.5 s or less, or better, around 0.2 s or less for round tops.

Not shown in FIG. 7 is the imaging subsystem that is used for inline curing in a combined imaging and curing apparatus.

While in one embodiment, the relative motion in the transverse direction is produced by relative motion between the light source and the plate, in some embodiments, e.g., flat bed embodiments, the relative motion is produced by a stationary light source and a rotating polygon minor as is known in the art.

Figure 8:
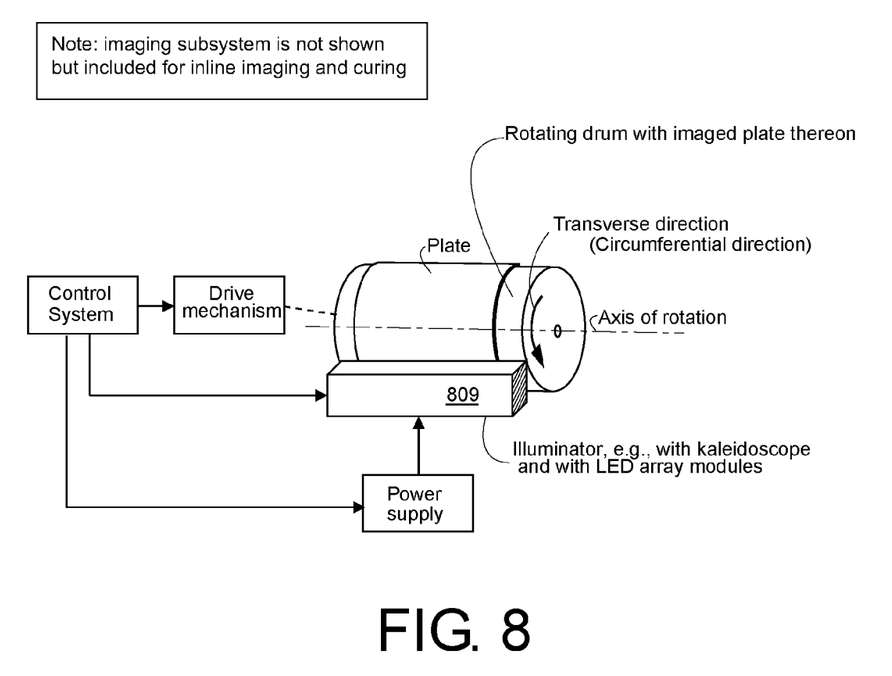
FIG. 8 shows an embodiment of a rotating drum arrangement in which the illumination unit extends to cover one dimension of the plate.

FIG. 8 shows a simple drawing of yet another embodiment of a rotating drum arrangement. In this arrangement, an illumination unit 809 is configured to illuminate the plate. In this embodiment, the illumination unit 809 extends to cover one dimension of the plate. In the example shown, this is the longitudinal direction. Relative motion in only one direction is then necessary, in this example, the circumferential, i.e., transverse direction. The control system is coupled to the drive mechanism and arranged to control the speed of rotation. The drive mechanism together with the control system is such that the speed of rotation can be controlled so as to result in either flat top halftone dots for relatively slow speed of rotation below 60 RPM, e.g., 10 RPM and round tops for speeds of rotation above 60 RPM, e.g., 400 RPM for round tops.

One advantage of the embodiment shown in FIG. 8 is that with it, inline curing is possible.

In FIGS. 5 to 8, some elements such as the illuminating source have different reference numbers but may be similar or identical in structure. Similarly the plate and other shown elements may be similar or identical even if different reference numerals are used.

Note that some of the arrangements above may include an imaging unit to enable inline imaging and curing. Other arrangements do not include the imaging unit. The invention is not limited to combining of the imaging and curing in one exposure apparatus, and in some arrangements, the imaging and curing can be carried out separately each in its own apparatus. Therefore, in some arrangements, there is a separate imaging apparatus, e.g., a rotating drum imaging apparatus as is known in the art, or a flatbed imaging apparatus as is known in the art, and also a separate curing apparatus, e.g., a flatbed arrangement that includes one or more features of the present invention or a rotating drum arrangement that includes one or more features of the present invention.

Other variations also are possible.

Note that in some embodiments, the control system is configured such that the two periods of repetition, that is the first the period of repetition and the higher second repetition period are preset for different plate types.

Other methods and apparatuses for curing plates to have features with flat tops or round tops using variable speed exposure are described in commonly owned U.S. patent application Ser. No. 12/909,626, filed Oct. 21, 2010 to first inventor Sievers, titled CURING OF PHOTO-CURABLE PRINTING PLATES WITH FLAT TOPS OR ROUND TOPS BY VARIABLE SPEED EXPOSURE, the contents of which are incorporated herein by reference.

Embodiments in which the Output of the UV Exposure Unit is Switchable Between (at Least) Two Levels.

In another embodiment, the illumination unit is configured to illuminate at two levels, a first illumination level and a second illumination level. In one such embodiment the illumination unit extends to cover one dimension of the plate. In one such embodiment, this is the longitudinal direction. Relative motion in only one direction is then necessary, in this example, the circumferential, i.e., transverse direction. One advantage of the embodiment shown is that with it, inline curing is possible with imaging.

Other embodiments in which the output of the UV exposure unit is switchable between (at least) two levels are described in commonly owned U.S. patent application Ser. No. 12/467,078 filed: May 15, 2009 to inventor Sievers, titled CURING OF PHOTO-CURABLE PRINTING PLATES WITH FLAT TOPS OR ROUND TOPS, published on Dec. 3, 2009 as US 20090294696 A1, the contents of which are incorporated herein by reference.

Such embodiments include both drum arrangements and flatbed arrangements.

A Method of Producing a Plate Having Flat Tops and Round Tops on the Same Plate Using a Digital Workflow.

In many jobs, it is desired to print some portions of the imaging data, e.g., portions that have solid and lineart features with flat tops, and to print other portions, e.g., portions that have screend features with round tops. The following are the steps of a method, prior to the present invention, of fabrication of a set of printing plates with linework and screen dot elements. The method is applicable, as an example, for a drum imager such as shown in FIG. 5 that includes inline UV curing switchable either via change of rotation speed, or via change of illumination intensity, between curing such that features have round tops and curing such that features have flat tops includes:

1) Partitioning the imaging data into imaging data containing the linework portions of the job and imaging data containing the screened portions of the job.
2) Loading a first plate having an ablatable layer on to the drum.
3) Accepting in the imager the imaging data containing the linework portions of the job.
4) Imaging using the imaging data containing the linework portions to ablate the linework portions on the ablatable material of the first plate.
5) After the imaging using the imaging data containing the linework, carrying out a first UV exposure step, the first step using a relatively low drum rotation speed such that flat top features are produced after processing the cured plate.
6) Unloading the first plate after first UV exposure step is completed.
7) Loading a second plate having an ablatable layer on to the drum.
8) Accepting in the imager the imaging data containing the screened portions of the job.
9) Imaging using the imaging data containing the screened portions to ablate the screened portions on the ablatable material of the second plate.
10) After the imaging using the imaging data containing the screened postions, carrying out a second UV exposure step, the second step using a relatively high drum rotation speed such that round top features are produced after processing the cured plate.
11) Unloading the second plate after second UV exposure is completed.

The two plates can now be used to separately print the linework portions and the screened portions of the job.

A feature of the present invention is overcoming the need for two separate plates, such that double processing of a single plate that has ablatable mask material thereon can be carried out on the imager, e.g., an ESKO Cyrel Digital Imager.

The following are the steps of one method embodiment of the present invention for preparing a single printing plate with linework features and screened features. These are provided again for a drum imager that includes inline UV curing switcable between curing such that features have round tops and curing such that features have flat tops. The method includes:

1) Partitioning the imaging data into a first subset of the imaging data, e.g., imaging data containing the linework portions of the job and a second subset of the imaging data, e.g., imaging data containing the screened portions the job.
2) Loading a plate having an ablatable layer on to the drum.
3) Accepting in the imager the first subset of the imaging data, e.g., the imaging data containing the linework portions of the job.

4) Imaging using the first subset of the imaging data, e.g., the imaging data containing the linework portions to ablate the linework portions on the ablatable material of the first plate.

5) After the imaging using the first subset of the imaging data, e.g., the imaging data containing the linework, carrying out a first UV exposure step, the first step using a relatively low drum rotation speed such that flat top features are produced after processing the cured plate.

6) Accepting in the imager the second subset of the imaging data, e.g., the imaging data containing the screened portions of the job.

7) Imaging using the second subset of the imaging data, e.g., the imaging data containing the screened portions to ablate the screened portions on the ablatable material on the same plate.

8) After the imaging using the second subset of the imaging data, e.g., the imaging data containing the screened postions, carrying out a second UV exposure step, the second step using a relatively high drum rotation speed such that round top features are produced after processing the cured plate.

9) Unloading the plate after the second UV exposure step is completed.

The single plate can now be processed, then used to print the linework portions and the screened portions of the job at the same time.

The first UV exposure step (the first cuing process) uses a higher effective irradiance for the curing than the second UV exposure step (the second curing process). The lower irradiance of the second exposure will not change the flat top nature of the features created by the first exposure step at the higher irradiance level. Rather, it will only continue curing the sockets of the flattop structures. Hence, high irradiance is first applied, e.g., by having a power-switchable source work at high power, or by having low speed relative motion during cure time. Low irradiance is then applied in the second UV exposure (curing) step. If the higher irradiance is applied after the low irradiance, there is a chance the round top structures might be altered into flat top structures.

In different embodiments, the effective irradiance can be altered by changing the UV power level rather than by changing the rotation speed of the drum.

Furthermore, in the more general case, rather than only a drum imager, any imager may be used that provides relative motion between a UV exposure unit and the surface of the imaged plate material that is to be cured.

While in the above example, the first subset of the imaging data was that containing linework, and the second subset was that containing screened portions, in some embodiments, other criteria are used to partition the imaging data into a first subset and a second subset. In one such other embodiment, the partitioning into the first and second subsets is according to the screen percentage. For example, in one such example, the first subset of imaging data is the imaging data in which all screened data have more than 70% screen value, and such subset is made with flat top structures. The second subset is everything screened at or below 70% screen value, and such imaging data is made with round top structures on the plate. Other threshold screen values also can be used, as would be clear to those in the art.

The described method embodiment has several features that are different than the method in which two plates are used, one for lineart, and the other for screened features. These include:

1) There is only a need for one plate, thus the material costs are less.

2) The processing time for fabricating the printing plate is shorter. For example, the time for loading and unloading a second plate is eliminated. As a second of 2, in some embodiments, the time for the curing with a first set of one or more curing parameters is sufficient to ensure flat tops on the printing features that have flat tops but not sufficient to totally cure the printing features that have flat tops on the plate. In such embodiment, the time for the curing with a second set of one or more curing parameters designed for producing round tops is sufficient to complete the curing of the printing features that have flat tops. Secondly, in an improved embodiment, the time for the first UV exposure step is sufficient to ensure that when totally cured, the features will have flat tops, but is less than the total time for curing by selecting the first UV exposure to be sufficient to ensure that when totally cured, the features will have flat tops, but such that the second exposure time is needed to completely cure the flat tops.

3) The time and costs needed for setting up a second printing plate are eliminated.

4) Registration problems that might occur in positioning the two plates (the first lineart features, and the one with screened features) are eliminated.

Generalization of the Inventive Method

Note that while the present invention is described according to round tops and flat tops, in one more general case, there are two types of structures, e.g., as defined by the shape of each of the structure after curing. The shape is determine by how curing is carried out. A method of controlling the curing is available, e.g., on a drum apparatus, or on a flatbed apparatus. What is described herein is a method of obtaining, on the same plate, both the first type and the second type of structure. It would be clear to one skilled in the art that if a technique of obtaining the two different structures is available by controlling the curing on the same curing apparatus, such an apparatus also capable of imaging, then the method described herein is capable of obtaining both types of structures on the same plate. The first type and second type are such that the first type is obtained by first exposing, e.g., to UV radiation and such that further exposing to obtain the second type either completes the curing for the first type, or does not harm the type of curing should the first exposure step completely cure the first type.

Furthermore, if there are three or even more than three different types of structures, i.e., a plurality, denoted by a number n≥2 of types of structures, the types being ordered according to the exposure, such that there is an ordering of which type is cured first, the method described herein may readily be extended to the n structures being made on the same plate. The imaging data is partitioned into n sets of imaging data, each set desired to end up as a corresponding one of the n structured on the plate. The method includes imaging with a first of the n sets of imaging data, then curing for that first type. The method continues with imaging using the second set of the imaging data, then exposing to cure for the second type, and continues until all the sets of the imaging data are imaged and all the types of structures are fully cured.

Possible Theory of Operation for Obtaining Round Tops and Flat Tops

In order to enhance understanding of features of the present invention, a theory of operation is presented. Any such theory or mechanism of operation or finding presented herein is not intended to make the present invention in any way dependent upon such theory, mechanism of operation or finding.

The inventor has noticed several properties of curing at different intensity levels, i.e., different levels of power per unit area. Using a very simplified view of polymerization process, polymerization can be broken up into three reaction steps:

1) Activation of the starter radicals by UV light.
2) Chain growth of the polymer.
3) Chain ending through oxygen.

Each reaction has a certain time constant and total time. For common polymer plates such as Cyrel DPI™ from E.I. Dupont de Nemours and Company, Wilmington, Del. (DuPont), the time for the entire curing process is between 12 and 15 minutes at an illumination intensity (power per unit area) of 19-20 mW/cm$^2$.

This results in an energy per unit area of 14.4 to 18 Joules/cm$^2$ to get all radicals starting chains. The activating the radicals step occurs relatively fast when a starter radical interacts with a light photon. A long exposure time is required because the polymer material is not fully packed with starter radicals, and not every photon hits a starter radical. Thus it takes a certain amount of photons and consequently energy, to activate all starter radicals and in principle they could be activated all at the same time.

Polymers include a certain amount of oxygen. However, because conventional processes still enable flat tops, the amount of oxygen inside the plate in itself is not sufficient to get round tops. For round tops, it is believed additional oxygen has to diffuse into the plate.

Diffusion in dense matter is a slow process. If the intensity is increased, that is, there are more photons per unit area, more polymer chains can be started, while the number of chains finished by oxygen remains the same as with the lower intensity.

Figure 4A:
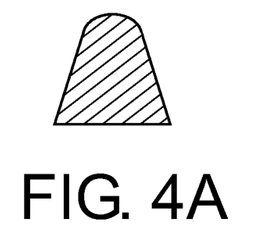
FIG. 4A shows simple cross-section representative of a round top halftone dot when the period of repeated irradiation of each region is higher than the medium time constant of the photopolymer or when a lower intensity of radiation is used for curing.
Figure 4B:
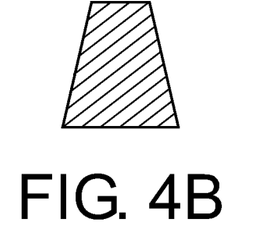
FIG. 4B shows simple cross-section representative of a flat top halftone dot, e.g., as obtained in a digital process at second intensity level when the period of repeated irradiation of each region is lower than the medium time constant of the photopolymer, and when a higher intensity if light radiation is used for curing.

The inventor has discovered that increasing the intensity can lead to more activation of the starter radicals. The inventor ran some experiments, and discovered that, starting with the specified curing for a plate, e.g., for certain common polymer types, e.g., DuPont's Cyrel DPI of exposure to around 19-20 mW/cm$^2$ for about 15 minutes, and then doubling the intensity from 20 mW/cm$^2$ to 40 mW/cm$^2$ gives a significant change from a convex round top to flat top. Indeed, if the power level is increased even further the top of the halftone dots will take a concave shape. FIG. 4A shows simple cross-section of a round top halftone dot, e.g., as obtained in a digital process at a first intensity level, e.g., 20 mW/cm$^2$. FIG. 4B shows simple cross-section of a flat top halftone dot, e.g., as obtained in a digital process at a second intensity level, e.g., 40 mW/cm$^2$.

In brief, one possible theory for why higher intensities can produce flat tops is that at higher UV intensities, more chains are started than are stopped by any oxygen present in a given exposure time.

One possible theory of operation for why the invention works is that if the relative speed of relative motion of the light source to the to-be-cured plate is fast enough, the received UV energy is integrated over the exposure time. That is, the UV light is distributed over the entire plate surface.

Suppose the irradiation of any region occurs by repeated radiation by the light source over a certain duty cycle. Suppose the UV radiation is repeated each period of time denoted by T, and occurs for an active time $\Delta T$. T of course is inversely proportional to the speed of relative motion between the light source and the plate.

The inventors have found that the effective intensity presented to the polymer material depends on the relationship between a time constant, denoted $\tau$ of the order of 10 to 20 second for common photopolymer plates. This is thought to be the time constant for the mobility of oxygen in the polymer material. If the irradiation of any give area of time occurs with a sufficiently high repetition rate with a relatively low duty cycle, that is, if for any part of the photopolymer, after each active time interval and before the repeated active time interval, there will be insufficient time for oxygen to stop polymer chains, then the exposure to light is integrated over the overall exposure time.

The inventors have found that there is an effective UV intensity. Denote by $I_0$, the intensity from the light source in units of power per unit area. The effective intensity, denoted $I_{eff}$ is:

$$I_{eff} = I_0[1-(1-\Delta T/T)\exp(-T/\tau)].$$

Note that if $T \geq \tau$, e.g., if $T \gg \tau$, then $I_{eff} \approx I_0$,
while if $T \ll \tau$, $I_{eff} \approx (\Delta T/T)I_0 < I_0$.

Figure 9:
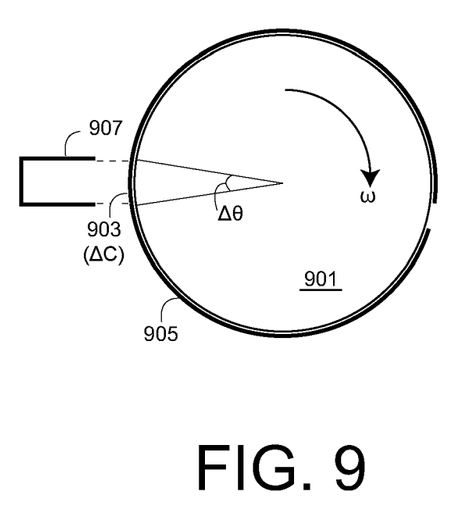
FIG. 9 shows a simplified cross sectional view of a rotating drum embodiment with a plate of the surface of the drum showing the small segment illuminated at any one time by a source of illumination, e.g., of UV light.

FIG. 9 shows a simplified cross sectional view of a rotating drum 901 with a plate 905 on the surface of the drum showing the small segment 903 illuminated at any one time by a source of illumination, e.g., of UV light. Suppose $\Delta\theta$ is the angle subtended by the area 903 on the surface of plate 905 that is illuminated at any one time by the light source 907. Suppose also that the overall circumference of the drum is C, and that the arc of the surface in the transverse direction corresponding to $\Delta\theta$ is $\Delta C$. Suppose also that the speed of rotation is $\omega$ radians/s, i.e., $60\omega/2\pi$ RPM. $T=2\pi/\omega$ seconds.

Then $\Delta T/T = \Delta\theta/2\pi = .\Delta\theta/2\pi = \Delta C/C$
In such a case, $$I_{eff} = I_0[1-(1-\Delta C/C)]\exp(-2\pi/\omega\tau)$$

Recall that the inventors have observed that $\tau$ is in the order of 10 s to 20 s for common photopolymer materials.

As is clear from FIG. 9, in rotating drum embodiments of the invention, if the speed of rotation is such the that period of rotation is more than about is to 2 s, i.e., if the drum rotates at less than about 60 RPM, then halftone dots having flat tops can be produced. If on the other hand, the speed of rotation is more than 60 RMP, e.g., 120 rpm or more, round tops are produced.

The Plates

By the terms "polymer plate" and "photopolymer plate" herein is meant a plate with any type of photo-curable material thereon, whether made of polymer or not. One example is UV-curable material. Another example is material cured by light of different wavelength, not necessarily UV. While today, such curing is typically carried out with UV, and such materials are typically photopolymers, use of the term "photopolymer" herein is not meant to be limiting to a polymer composition. The inventor anticipates that in the future, there may be new materials and compositions that also are curable by UV radiation of a desired wavelength, and the invention is equally applicable to plates having such material thereon.

The method and apparatuses described herein are used for curing many types of plates. The plates can be flexographic plates, flexographic imaging cylinders, flexographic sleeves, and so forth. The plate also can be letterpress plates having UV curable material thereon. Furthermore, the plates can be imaged using a digital process, e.g., by laser ablating an abatable surface on the plate material prior to final curing, so that curing is with the mask on the plate material after ablation of some of the mask material according to imaging data.

Therefore, in some embodiments, the plate is a photopolymer printing plate that is a digital plate.

In some embodiments, the plate is a photopolymer printing plate that is a sleeve.

In some embodiments, the plate is a photopolymer printing plate that is a polymer coated cylinder.

Furthermore, some embodiments of the invention are in the form of a plate—any of the plates described above—that has been cured, the curing according to a method as described herein.

Furthermore, some embodiments of the invention are in the form of a plate—any of the plates described above—that has been imaged then cured, the curing according to a method as described herein.

General

Unless specifically stated otherwise, as apparent from the following discussions, it is appreciated that throughout the specification discussions utilizing terms such as "processing," "computing," "calculating," "determining" or the like, refer to the action and/or processes of a computer or computing system, or similar electronic computing device, that manipulate and/or transform data represented as physical, such as electronic, quantities into other data similarly represented as physical quantities.

In a similar manner, the term "processor" may refer to any device or portion of a device that processes electronic data, e.g., from registers and/or memory to transform that electronic data into other electronic data that, e.g., may be stored in registers and/or memory. A "computer" or a "computing machine" or a "computing platform" may include one or more processors.

Note that when a method is described that includes several elements, e.g., several steps, no ordering of such elements, e.g., of steps is implied, unless specifically stated.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the above description of example embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the DESCRIPTION OF EXAMPLE EMBODIMENTS are hereby expressly incorporated into this DESCRIPTION OF EXAMPLE EMBODIMENTS, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

As used herein, unless otherwise specified the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

All U.S. patent publications, U.S. patents, and U.S. patent applications cited herein are hereby incorporated by reference. In particular, any publicly available material that is in such cited U.S. patent publications, U.S. patents, and U.S. patent applications is referred to herein as if it is part of the present application. In the case the Patent Rules or Statutes do not permit incorporation by reference of material, Applicant maintains the right to amend the specification to include any such material by such amending of the specification. Thus non-enablement for lack of such material is avoided. In the case the Patent Rules or Statutes do not permit incorporation by reference of material that itself incorporates information by reference, the incorporation by reference of the material herein excludes any information incorporated by reference in such incorporated by reference material, unless such information is explicitly incorporated herein by reference.

Any discussion of prior art in this specification should in no way be considered an admission that such prior art is widely known, is publicly known, or forms part of the general knowledge in the field.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting only of elements A and B. Any one of the terms including or which includes or that includes as used herein is also an open term that also means including at least the elements/features that follow the term, but not excluding others. Thus, including is synonymous with and means comprising.

Similarly, it is to be noticed that the term coupled, when used in the claims, should not be interpreted as being limitative to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

We claim:

1. A method of imaging a printing plate with imaging data and curing the printing plate made of or having photo-curable material thereon, the photo-curable material including an ablatable mask thereon, the method comprising:
    imaging the ablatable mask on the printing plate with a first portion of imaging data to produce a partially imaged uncured plate, the imaging data comprising the first portion of imaging data and a second portion of imaging data;
    curing the partially imaged uncured plate using light energy at a wavelength or wavelengths suitable for curing the photo-curable material with a first set of one or more curing parameters to produce a partially cured plate with a partially ablated mask thereon, the curing providing total energy per unit time per unit area arranged for producing flat top features;
    imaging the partially ablated mask on the partially cured plate with the second portion of imaging data to produce a totally imaged partially cured plate;
    curing the totally imaged partially cured plate with a second set of one or more curing parameters to produce a totally cured plate, the curing providing total energy per unit time per unit area arranged for producing round top features,
    wherein the first set of imaging parameters and the second set of imaging parameters are arranged such that the first portion of imaging data has printing features with flat tops on the totally cured plate and the second portion of imaging data has printing features with round tops on the totally cured plate.

2. A method as recited in claim 1,
    wherein the curing uses UV light, and the first and second sets of curing parameters differ in at least one of UV irradiance, UV power, UV exposure time, and, in the case there is periodic repeating exposure of any part of the plate, the period of repetition.

3. A method as recited in claim 1, wherein the time for the curing with the first set of one or more curing parameters is sufficient to ensure flat tops on the printing features that have flat tops but not sufficient to totally cure the printing features that have flat tops on the plate, and wherein the time for the curing with the second set of one or more curing parameters is sufficient to complete the curing of the printing features that have flat tops.

4. A method as recited in claim 1, wherein the time for the curing with the first set of one or more curing parameters is sufficient to ensure flat tops and sufficient to totally cure the printing features that have flat tops.

5. A method as recited in claim 1,
    wherein the curing includes illuminating the printing plate using light energy at a wavelength or wavelengths suitable for curing the photo-curable material using a light exposure unit, and producing relative motion in at least one direction between the light from the light exposure unit and the plate during the illuminating of the plate, including repeating exposure of any part of the plate with a period of repetition, and
    wherein the period of repetition is controllable between a first repetition period and a second higher repetition period, such that curing the totally imaged partially cured plate is at the second higher repetition period to produce printing features that have round tops, and curing at the first repetition period produces printing features that have flat tops, the overall fluence at the first repetition period and at the second repetition period being sufficient to totally cure the printing plate.

6. A method as recited in claim 5, wherein the photo-curable material is curable by ultraviolet light, and wherein the light exposure unit is a source of ultraviolet energy.

7. A method as recited in claim 5, wherein the period of repetition for producing flat top features is more than 2 seconds, and the period of repetition for producing round top features is less than ½ second.

8. A method as recited in claim 5, wherein the light exposure unit is arranged, for a particular rotating drum arrangement in the case of a rotating drum or a different flatbed size in the case of a flatbed arrangement, to provide for the second repetition period an effective illumination the same as specified for curing the plate for round tops in a stationary illumination device.

9. A method as recited in claim 5, wherein the plate is on a rotating drum such that the relative motion includes motion in a transverse direction, and
    wherein (i) the light exposure unit extends to cover the length of the drum; or (ii) the light exposure unit during curing moves relative to the printing plate in a longitudinal direction parallel to the axis of rotation of the rotating drum on which the plate is attached.

10. A method as recited in claim 5, wherein the light from the light exposure unit moves back and forth in a transverse direction relative to the plate during curing above the plate placed on a flatbed table.

11. A method as recited in claim 1,
    wherein the curing includes illuminating the printing plate using light energy at a wavelength or wavelengths suitable for curing the photo-curable material using a light exposure unit, and producing relative motion in at least one direction between the light from the light exposure unit and the plate during the illuminating of the plate,
    wherein the light exposure unit is capable of generating at least a first illumination intensity and a second illumination intensity, and
    wherein the curing of the partially imaged uncured plate and the curing of the totally imaged partially cured plate are at different illumination levels arranged such that the first portion of imaging data has printing features that have flat tops on the totally cured plate and the second portion of imaging data has printing features that have round tops on the totally cured plate.

12. A method as recited in claim 11, wherein the photo-curable material is curable by ultraviolet light, and wherein the light exposure unit is a source of ultraviolet energy.

13. A method as recited in claim 11, wherein the plate is on a rotating drum such that the relative motion includes motion in a transverse direction, and
    wherein (i) the light exposure unit extends to cover the length of the drum; or (ii) the light exposure unit during curing moves relative to the printing plate in a longitudinal direction parallel to the axis of rotation of the rotating drum on which the plate is attached.

14. A method as recited in claim 11, wherein the light from the light exposure unit moves back and forth in a transverse direction relative to the plate during curing above the plate placed on a flatbed table.

15. A method as recited in claim 1, wherein the photo-curable plate is one of a photopolymer printing plate that is a flexographic plate, a photopolymer printing plate that is a flexographic sleeve, a photopolymer printing plate that is a polymer coated flexographic cylinder, or a photopolymer printing plate that is a letterpress plate.

16. A method as recited in claim 1, wherein the plate is illuminated by a light exposure unit that can illuminate the plate with a period of repetition denoted T, wherein the effective intensity denoted Ieff for curing the photo-curable material during the period of repetition T, in which the light exposure unit illuminates each part of the plate for an amount of time denoted $\Delta T$ can be determined from the approximate relationship:

$$Ieff = I0[1-\{1-\Delta T/T\}\exp(-T/\tau)],$$

wherein $\tau$ is a property of the printing plate with the photo-curable material thereon, such that for T significantly less than $\tau$, $Ieff \approx (\Delta T/T)I0$.

17. A method as recited in claim 1, wherein the plate is illuminated by a light exposure unit that includes a plurality of LEDs producing ultraviolet light and a power supply therefor, or includes a plurality of arc lamps producing ultraviolet light, or includes a plurality of fluorescent lamps producing ultraviolet light.

18. A method as recited in claim 1, wherein the plate is illuminated by a light exposure unit that includes:
- a light tunnel of light-reflective walls and having a polygonal cross-section like a kaleidoscope, each wall having a reflective inner surface; and
- a light source located at or near one end, called the source end of the light tunnel and arranged to produce light radiation to the inside of the light tunnel towards the other end of the light tunnel, called the plate end of the light tunnel, including towards the reflective inner surfaces of the walls.

19. A printing plate made of or having photo-curable material thereon prepared and cured according to a method of imaging the printing plate with imaging data and curing the printing plate, the photo-curable material including an ablatable mask thereon, the method comprising:
- imaging the ablatable mask on the printing plate with a first portion of imaging data to produce a partially imaged uncured plate, the imaging data comprising the first portion of imaging data and a second portion of imaging data;
- curing the partially imaged uncured plate using light energy at a wavelength or wavelengths suitable for curing the photo-curable material with a first set of one or more curing parameters to produce a partially cured plate with a partially ablated mask thereon, the curing providing total energy per unit time per unit area arranged for producing flat top features;
- imaging the partially ablated mask on the partially cured plate with the second portion of imaging data to produce a totally imaged partially cured plate;
- curing the totally imaged partially cured plate with a second set of one or more curing parameters to produce a totally cured plate, the curing providing total energy per unit time per unit area arranged for producing round top features,
- wherein the first set of imaging parameters and the second set of imaging parameters are arranged such that the first portion of imaging data has printing features with flat tops on the totally cured plate and the second portion of imaging data has printing features with round tops on the totally cured plate.

* * * * *